United States Patent
Kim et al.

(10) Patent No.: US 7,229,672 B2
(45) Date of Patent: Jun. 12, 2007

(54) INSULATING FILM COMPOSITION HAVING IMPROVED MECHANICAL PROPERTY

(75) Inventors: Taewan Kim, Seoul (KR); Jihoon Rhee, Seongnam-si (KR); Daechul Park, Suwon-si (KR); Jongbaek Seon, Yongin-si (KR); Kwanghee Lee, Suwon-si (KR); Hyundam Jung, Suwon-si (KR)

(73) Assignee: Samsung Corning Co., Ltd. (KR)

( * ) Notice: Subject to any disclaimer, the term of this patent is extended or adjusted under 35 U.S.C. 154(b) by 176 days.

(21) Appl. No.: 11/021,048

(22) Filed: Dec. 22, 2004

(65) Prior Publication Data
US 2005/0159001 A1    Jul. 21, 2005

(30) Foreign Application Priority Data
Dec. 23, 2003   (KR) .................... 10-2003-0095793

(51) Int. Cl.
*B05D 3/02*   (2006.01)
(52) U.S. Cl. .................... 427/387; 524/492; 524/493; 524/356; 524/315; 524/588; 525/446
(58) Field of Classification Search .................... None
See application file for complete search history.

(56) References Cited

U.S. PATENT DOCUMENTS

| 2,433,776 | A | * | 12/1947 | Marshall ....................... 516/34 |
| 5,013,585 | A | * | 5/1991 | Shimizu et al. ............. 427/220 |
| 6,153,689 | A | * | 11/2000 | Itoh et al. ................... 524/588 |
| 6,403,105 | B1 | * | 6/2002 | Stein ........................... 424/400 |
| 6,599,631 | B2 | * | 7/2003 | Kambe et al. ............... 428/447 |
| 2002/0022117 | A1 | * | 2/2002 | Kitamura et al. ........... 428/195 |
| 2003/0035888 | A1 | * | 2/2003 | Eriyama et al. ............ 427/212 |

FOREIGN PATENT DOCUMENTS

EP    768 351    *    4/1997

* cited by examiner

*Primary Examiner*—Marc S. Zimmer
(74) *Attorney, Agent, or Firm*—Anderson Kill & Olick, PC

(57) ABSTRACT

An insulating film forming composition having good mechanical and insulating properties comprises a silica sol having a good dispersion stability, an organic siloxane polymer and a hydrophobic organic solvent, wherein the silica sol has primary-particles having an average particle size of 5 to 15 nm and secondary-particles having an average particle size of 70 to 100 nm, and the combined amount of said primary and secondary silica particles is in the range of 2 to 50% by weight based on the sum of the silica particles and organic siloxane polymer.

8 Claims, 2 Drawing Sheets

INSULATING FILM COMPOSITION HAVING IMPROVED MECHANICAL PROPERTY

FIELD OF THE INVENTION

The present invention relates to a composition for forming an insulating film for a semiconductor device.

BACKGROUND OF THE INVENTION

In development of ultra large scale integration (ULSI) technology, there has emerged the problem of increased capacitance of intra- and interlayers, causing signal delays. Therefore, many attempts have been made to develop an insulating layer matrix for reducing the capacitance of intra- and interlayers.

For example, U.S. Pat. No. 5,853,808 discloses a composition comprising an organic siloxane polymer and a silsesquioxane polymer; European Patent Publication No. 0 997 497 A1 discloses a composition obtained from a mixture of various alkoxysilanes; and Korean Patent No. 343938 discloses an organic siloxane composition obtained from cyclic siloxane monomers. These organic siloxane polymers may provide insulating films having a relatively low dielectric constant, but, the films thus prepared have poor mechanical properties.

Meanwhile, techniques using a porous silica as a matrix for an insulating film have been suggested (Japanese Patent Application Publication Nos. 1997-315812, 1997-313812 and 2003-249495; U.S. Pat. No. 6,261,357; and European Patent Publication No. 0 992 556 A1): an insulating film is prepared using porous silica particules whose surface is treated with an alkoxy silane, halogenated silane, etc. Also, Japanese Patent Application Publication No. 1999-50007 discloses a silica nanocluster to be used in a low dielectric film. However, the above techniques have disadvantages in that the porosity which affects the dielectric constant of the resulting film is difficult to control.

SUMMARY OF THE INVENTION

Accordingly, it is an object of the present invention to provide a composition for forming an insulating film having improved mechanical and insulating properties.

In accordance with the present invention, there is provided a composition for forming an insulating film, comprising a silica sol, an organic siloxane polymer and a hydrophobic organic solvent, wherein the silica sol has primary-particles having an average particle size of 5 to 15 nm and secondary-particles having an average particle size of 70 to 100 nm, and the combined amount of said primary and secondary silica particles is in the range of 2 to 50% by weight based on the sum of the silica particles and organic siloxane polymer.

BRIEF DESCRIPTION OF THE DRAWINGS

The above and other objects and features of the present invention will become apparent from the following description thereof, when taken in conjunction with the accompanying drawings, which respectively show.

DETAILED DESCRIPTION OF THE INVENTION

Figure 1:
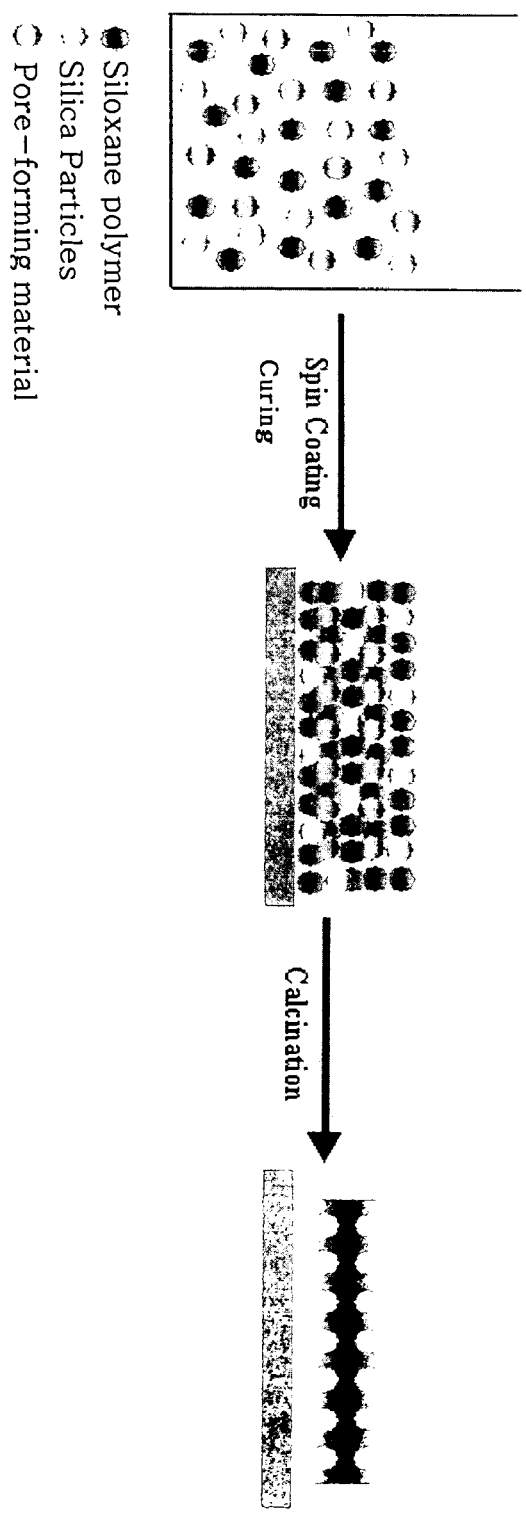
FIG. 1: a schematic view showing the process for forming an insulating film using the composition of the present invention.

The term "primary-particle" herein means an individual particle or grain, and the term "secondary-particle" herein means agglomerated primary particles which act as a single particle.

The inventive insulating film forming composition is characterized by comprising a silica sol having a uniform particle distribution and an organic siloxane polymer.

The silica sol used in the present invention is preferably obtained by mixing a silica sol dispersed in an alcohol with a hydrophobic organic solvent and removing the alcohol therefrom by evaporation. The silica sol thus obtained using without surface treatment or additives has excellent dispersibility. The hydrophobic organic solvent which may be used in the preparation of the silica sol includes an organic solvent having at least one carbonyl group (C=O), a carbon number of 5 to 20 and a boiling point ranging from 100 to 200° C., e.g., propyleneglycol monomethylether acetate (PGMEA), methylisobutylketone (MIBK), diethylketone, methylpropylketone, ethylpropylketone, dipropylketone, butylethylketone, methylisoamyl ketone, butylisopropylketone and a mixture thereof. The silica sol dispersed in a hydrophobic organic solvent preferably contains primary-particles and secondary-particles having average particle sizes in the ranges of 5 to 15 nm and 70 to 100 nm, respectively, and contains only a minimal amount (less than 2% by weight) of residual organic materials adsorbed on the silica particles, while the metal content thereof is practically nil, less than 10 ppm.

The composition of the present invention comprises solids consisting essentially of silica particles introduced as the silica sol and the siloxane polymer.

In the present invention, the silica sol is used in such an amount that silica particles are present in an amount of 2 to 50% by weight, preferably 8 to 20% by weight, based on the sum of the silica particles and organic siloxane polymer in the composition. When the silica particles are present in an amount more than 50% by weight, the resulting film has a high dielectric constant. When the silica particles are present in an amount less than 2% by weight, mechanical properties of the resulting film deteriorate.

The organic siloxane polymer which may be used in the present invention includes any one of those used in conventional insulating films, and a siloxane polymer having a hydroxyl- or acetoxy-terminated group is preferred. For example, the organic siloxane polymer may be selected from a siloxane homopolymer; a copolymer of a siloxane monomer and other monomer; and a polymer obtained from at least one compound selected from the group consisting of methylsilsesquinoxane (MSQ), hydrosilsesquinoxane (HSQ) and a derivative thereof. It is preferred that the organic siloxane polymer have a weight-average molecular weight of 1,000 to 300,000 and a hydroxyl- or acetoxy-terminated group in an amount of 5% or more based on the total weight of the polymer.

In the present invention, the organic siloxane polymer is used in an amount of 50 to 98% by weight, preferably 80 to 92% by weight, based on the sum of the silica particles and organic siloxane polymer in the composition so as achieve good stability and a desired coating thickness.

In the present invention, the solids consisting essentially of the silica particles and organic siloxane polymer are present in an amount of 2 to 75% by weight, based on the total weight of the composition.

The hydrophobic organic solvent used in the inventive composition may be any of those used in the silica sol preparation. In the present invention, the hydrophobic organic solvent may be used in an amount of 0.3 to 30 folds by weight based on the sum of the silica particles and organic siloxane polymer in the composition.

The composition according to the present invention may further comprise a porogen to improve insulating property. The porogen which may be used in the present invention includes any one of those used in conventional insulating films, and among them, cyclodextrin, polycaprolactone and a derivative thereof are preferred. The porogen may be used in an amount of 0.1 to 50% by weight based on the sum of the silica particles and organic siloxane polymer in the composition.

If necessary, the composition according to the present invention may further comprise other functional additives known in the art.

In accordance with the present invention, an insulating film having good mechanical and insulating properties can be obtained by coating the inventive composition on a substrate and curing and calcinating the coated film, as schematically shown in FIG. 1.

The substrate which may used in the present invention may be made of silicon, $SiO_2$, SiN, germanium, gallium-arsenic or indium-antimony, and the insulating film-coated substrate may be used in a semiconductor device as is or after surface-coating with other material.

The coating process may be conventionally conducted by a spin coating, dip coating, spray coating, flow coating or screen printing method. It is preferred to conduct spin coating at a rate of 800 to 5,000 rpm.

The curing process of the coating may be conducted at a temperature ranging 150 to 300° C. for 1 to 150 minutes, preferably 1 to 30 minutes and the calcination may be conducted at a temperature ranging 300 to 600° C. for 30 to 120 minutes, preferably 60 minutes, so as to induce volatilization of organic materials and condensation of the silica sol and an organic siloxane polymer. The curing and calcining processes may be conducted in air or an inert atmosphere under a reduced pressure, preferably in a nitrogen atmosphere and under a vacuum.

The inventive insulating film may have a thickness of 0.05 to 10 μm, preferably 0.1 to 5 μm, pores having a diameter of 2 nm or less, a distance between particles of 5 to 10 nm and a low density of 0.3 to 1.3 $g/cm^3$, preferably 0.2 to 1.2 $g/cm^3$.

Accordingly, the inventive insulating film having a relative high $SiO_2$ content has a low dielectric constant and good mechanical properties, and is useful for fabricating intralayers and/or interlayers of semiconductor devices.

The present invention will be described in further detail by the following Examples, which are, however, not intended to limit the scopes of the present invention.

EXAMPLE

Preparation: Preparation of Silica Sol

A silica sol dispersed in isopropyl alcohol (IPA) (solids content: 10.3% by weight) having particles of an average size of 5 to 20 nm was treated with an ion exchange resin to remove residual metal cations. 200 ml of the silica sol dispersion thus obtained was subject to grinding with a wet crushing equipment at 0° C. for 10 min, and filtered through a 0.2 μm syringe filter. The filtered silica sol (solids content: 10.1% by weight) was placed in a low-temperature vacuum evaporator which had previously been nitrogen-purged, 200 ml of PGMEA cooled to −20° C. was added thereto, and the mixture was stirred slowly (below 100 rpm) at 0° C. for 3 hours. The resulting silica sol was wet-ground at 0° C. for 10 min, and filtered through a 0.2 μm syringe filter to obtain a desired silica sol (solids content: 10.1% by weight).

The particle size, and the residual IPA and metal ion contents of the resulting silica sol were analyzed with a particle size analyzer (PSA), gas chromatography-mass spectrometer (GC-MS) and inductively coupled plasma-mass spectrometer (ICP-MS), respectively, and the results were:

average primary-particle size: 5 to 10 nm;
average secondary-particle size: 90.8 nm;
residual IPA content: 1.06% by weight; and
residual metal ion content: below 10 ppm.

Preparation of Coating Composition

Examples 1 to 3

The silica sol obtained in Preparation and MSQ-based siloxane polymer were added to PGMEA according to Table 1, to obtain 10 g of a composition having a solid (siloxane polymer+silica particles) content of 22% by weight. The procedure was repeated to prepare two more compositions having solid contents of 26% and 30% by weight, respectively.

Comparative Examples 1 to 3

The procedure of Examples 1 to 3 was repeated except that the silica sol was not employed, to obtain 10 g of a composition.

Examples 4 to 6

The silica sol obtained in Preparation, MSQ-based siloxane polymer and heptakis[2,3,6-tri-O-methoxy]-β-cyclodextrin as a porogen were added to PGMEA according to Table 2, to obtain 10 g of a composition having a solid (siloxane polymer+silica particles) content of 22% by weight, wherein the content of the porogen was adjusted to an amount of 30% by weight based on the solid content. The procedure was repeated to prepare two more compositions having solid contents of 26% and 30% by weight, respectively.

Comparative Examples 4 to 6

The procedure of Examples 4 to 6 was repeated except that the silica sol was not employed, to obtain 10 g of a composition.

Example 7

The procedure of Example 1 was repeated except that the silica sol obtained in Preparation, MSQ-based siloxane polymer and PGMEA were used in various amounts as shown in Table 3, to obtain 10 g of five compositions.

Example 8

The procedure of Example 4 was repeated except that the silica sol obtained in Preparation, MSQ, heptakis[2,3,6-trimethoxy]-β-cyclodextrine as a porogen and PGMEA were used in various amounts as shown in Table 4, to obtain five compositions.

Preparation and Evaluation of Insulating Film

A silicon wafer was spin-coated using one of the compositions obtained in Examples 1–8 and Comparative Examples 1–6 at 3000 rpm for 30 seconds, and cured at 150° C. for 1 min and 250° C. for 1 min on a hot plate under a nitrogen atmosphere to obtain a film. The resulting film was calcined at 400° C. for 1 hour under a vacuum to form an insulating film.

The insulating films obtained by repeating the above procedure were evaluated for the following properties and the results are represented in Tables 1 to 4.

(1) Dielectric Constant

An insulating film sample was used to obtain a specimen having a MIM (metal-insulator-metal) structure for measurement of dielectric constant thereof. The electrostatic capacities at frequencies of 10 kHz, 100 kHz and 1 MHz of the specimen were measured using Precision LCR Meter HP4284A equipped with Micromanipulator 6200 Probe Station; and the thickness of the specimen was determined using a prism coupler. Then, the dielectric constant of the specimen was calculated using the following equation.

$$k = C \times d / \epsilon_\circ \times A$$

wherein, k is the dielectric constant of the film; C, the electrostatic capacity; d, the thickness; $\epsilon_\circ$, the dielectric constant under vacuum; and A, the contact area of the electrode.

(2) Hardness and Elastic Modulus

The hardness and elastic modulus of the specimen were measured using Nano Indenter II manufactured by MTS Systems Co.

As can be seen from Tables 1 and 2, the insulating film obtained from the inventive composition has improved hardness and elastic modulus superior to those of the film obtained from the composition having no silica sol. Also, the insulating film of the present invention has a dielectric constant of 2.8 or less.

TABLE 3

| Composition No. | Components of Composition (22 wt % solids) | | | Properties of the insulating film | | |
|---|---|---|---|---|---|---|
| | Siloxane Polymer (g) | Silica sol (g) | PGMEA (g) | Dielectric Constant | Hardness (Gpa) | Elastic Modulus (Gpa) |
| Control | 2.6 | 0 | 7.4 | 2.70 | 1.101 | 5.741 |
| 1 | 2.457 | 1.43 | 6.113 | 2.79 | 1.207 | 6.274 |
| 2 | 2.314 | 2.86 | 4.826 | 2.84 | 1.220 | 6.730 |
| 3 | 2.054 | 5.46 | 2.486 | 3.09 | 1.223 | 7.311 |
| 4 | 1.794 | 8.06 | 0.146 | 3.14 | 1.365 | 8.882 |

TABLE 1

| Ex. No. | Composition | | | Solids Component | | Properties of Insulating Film | | | |
|---|---|---|---|---|---|---|---|---|---|
| | Siloxane Polymer (wt %) | Silica Sol (wt %) | PGMEA (wt %) | Siloxane Polymer (g) | Silica Particles (g) | Thickness (μm) | Dielectric Constant | Hardness (Gpa) | Elastic Modulus (Gpa) |
| Com. Ex. 1 | 22 | 0 | 78 | 2.2 | 0 | 0.6315 | 2.70 | 1.035 | 5.465 |
| Ex. 1 | 21.45 | 5.5 | 73.05 | 2.145 | 0.055 | 0.8266 | 2.78 | 1.064 | 5.926 |
| Com. Ex. 2 | 26 | 0 | 74 | 2.6 | 0 | 0.8371 | 2.70 | 1.101 | 5.741 |
| Ex. 2 | 25.35 | 6.5 | 68.15 | 2.535 | 0.065 | 1.1544 | 2.77 | 1.160 | 6.251 |
| Com. Ex. 3 | 30 | 0 | 70 | 3 | 0 | 1.1238 | 2.70 | 1.039 | 5.611 |
| Ex. 3 | 29.25 | 7.5 | 63.25 | 2.925 | 0.075 | 1.4097 | 2.80 | 1.073 | 6.300 |

TABLE 2

| Ex. No. | Composition | | | | Solids Content | | | Properties of the insulating film | | | |
|---|---|---|---|---|---|---|---|---|---|---|---|
| | Siloxane Polymer (wt %) | Silica Sol (wt %) | Porogen (wt %) | PGMEA (wt %) | Siloxane Polymer (g) | Silica Particles (g) | Porogen (g) | Thickness (μm) | Dielectric Constant | Hardness (Gpa) | Elastic Modulus (Gpa) |
| Com. Ex. 1 | 20.64 | 0 | 6.2 | 73.16 | 2.2 | 0 | 0.66 | 0.4536 | 2.24 | 0.538 | 3.098 |
| Ex. 1 | 20.12 | 5.14 | 6.2 | 68.54 | 2.145 | 0.055 | 0.66 | 0.5328 | 2.40 | 0.694 | 4.018 |
| Com. Ex. 2 | 24.12 | 0 | 7.24 | 68.64 | 2.6 | 0 | 0.78 | 0.6620 | 2.24 | 0.483 | 3.068 |
| Ex. 2 | 23.52 | 6.01 | 7.24 | 63.24 | 2.535 | 0.065 | 0.78 | 0.7303 | 2.37 | 0.758 | 4.370 |
| Com. Ex. 3 | 27.52 | 0 | 12.86 | 64.22 | 3 | 0 | 0.9 | 0.8894 | 2.24 | 0.542 | 2.976 |
| Ex. 3 | 26.83 | 6.84 | 8.26 | 58.07 | 2.925 | 0.075 | 0.9 | 0.9722 | 2.43 | 0.641 | 4.087 |

TABLE 4

| Composition No. | Components of Composition (22 wt % solids) | | | | Properties of insulating film | | |
|---|---|---|---|---|---|---|---|
| | Siloxane Polymer (g) | Silica sol (g) | Porogen (g) | PGMEA (g) | Dielectric Constant | Hardness (Gpa) | Elastic Modulus (Gpa) |
| Control | 2.6 | 0 | 0.78 | 7.4 | 2.24 | 0.483 | 3.072 |
| 1 | 2.457 | 1.43 | 0.78 | 6.113 | 2.35 | 0.723 | 4.616 |
| 2 | 2.314 | 2.86 | 0.78 | 4.826 | 2.48 | 0.862 | 5.391 |
| 3 | 2.054 | 5.46 | 0.78 | 2.486 | 2.59 | 1.064 | 6.123 |
| 4 | 1.794 | 8.06 | 0.78 | 0.146 | 2.75 | 1.175 | 7.648 |

As can be seen from Tables 3 and 4, as the amount of the silica sol increases, the hardness and elastic modulus of the film increase. Also, the use of a porogen lowered the dielectric constant.

Figure 2:
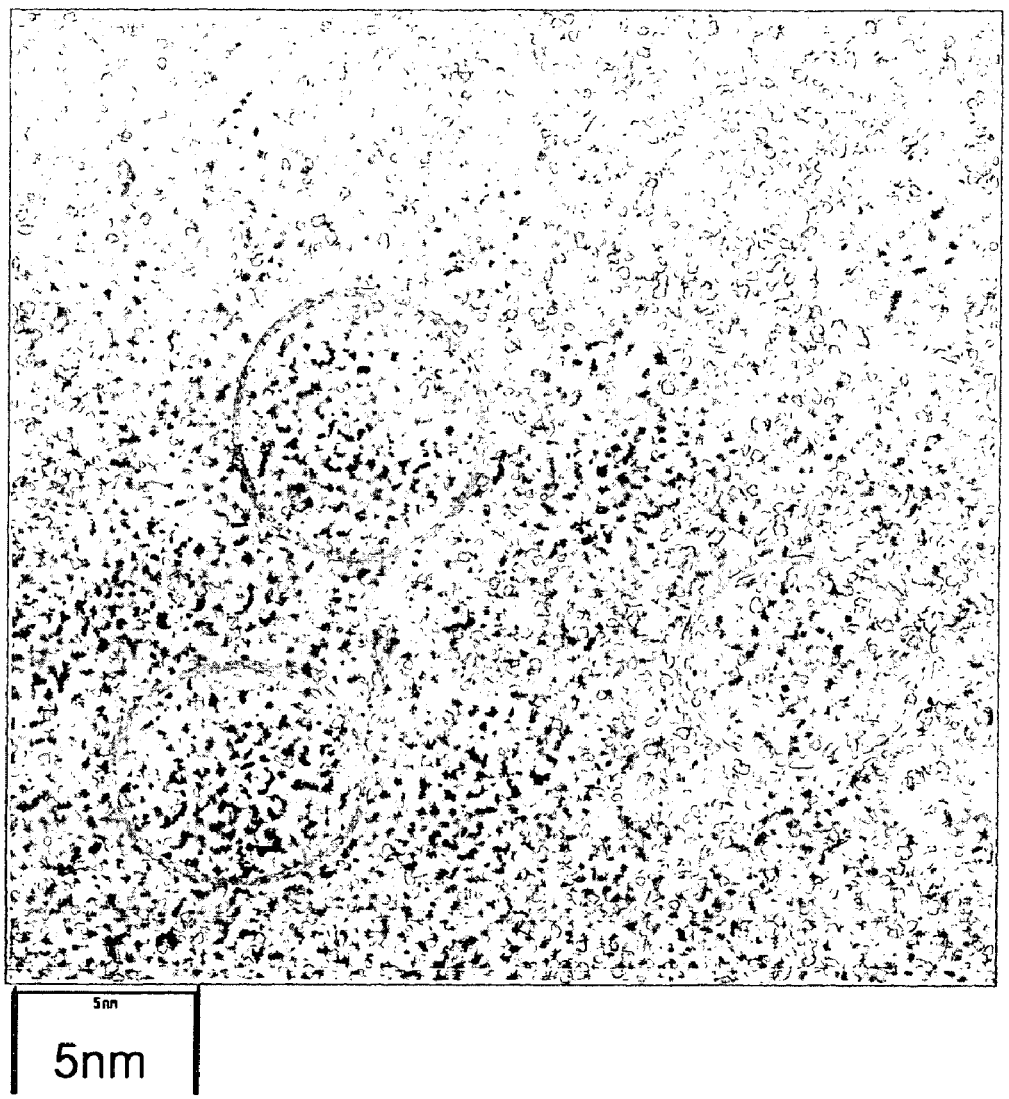
FIG. 2: a transmission electron microscope (TEM) photograph of the insulating film formed using the composition obtained in Example 1.

Further, a TEM photograph of the insulating film obtained from the composition of Example 1 is shown in FIG. 2. From FIG. 2, it can be seen that silica particles having a size of 5 nm are homogeneously dispersed in the organic siloxane matrix.

Thus, the inventive composition can be used in the preparation of an insulating film having good mechanical and insulating properties.

While the invention has been described with respect to the above specific embodiments, it should be recognized that various modifications and changes may be made to the invention by those skilled in the art which also fall within the scope of the invention as defined by the appended claims.

What is claimed is:

1. A composition for forming an insulating film, comprising a silica sol, an organic siloxane polymer and a hydrophobic organic solvent, wherein the silica sol has primary-particles having an average particle size of 5 to 15 nm and secondary-particles having an average particle size of 70 to 100 nm, the combined amount of said primary and secondary silica particles is in the range of 2 to 50 % by weight based on the sum of the silica particles and organic siloxane polymer, and the hydrophobic organic solvent has at least one carbonyl group (C=O), a carbon number of 5 to 20 and a boiling point ranging from 100 to 200° C.

2. The composition according to claim 1, wherein the silica sol is obtained by mixing a silica sol dispersed in an alcohol with a hydrophobic organic solvent and removing the alcohol therefrom.

3. The composition according to claim 1, wherein the solvent is selected from the group consisting of propyleneglycol monomethylether acetate (PGMEA), methylisobutylketone (MIBK), diethylketone, methylpropylketone, ethylpropylketone, dipropylketone, butylethylketone, methylisoamylketone, butylisopropylketone and a mixture thereof.

4. The composition according to claim 1, wherein the silica sol contains less than 2% by weight of residual organic materials adsorbed on the silica particles and less than 10 ppm of metal.

5. The composition according to claim 1, wherein the organic siloxane polymer is selected from a siloxane homopolymer; a copolymer of a siloxane monomer and other monomer; and a polymer obtained from at least one compound selected from the group consisting of methylsilsesquinoxane (MSQ), hydrosilsesquinoxane (HSQ) and a derivative thereof.

6. The composition according to claim 1, which further comprises a porogen in an amount of 0.1 to 50% by weight based on the sum of the silica particles and organic siloxane polymer.

7. The composition according to claim 6, wherein the porogen is at least one selected from cyclodextrin, polycaprolactone and a derivative thereof.

8. An insulating film obtained by coating the composition according to any one of claims 1, 2, 3–5, 6 and 7 on a substrate and curing and calcining the coated film.

* * * * *